(12) United States Patent
Mun et al.

(10) Patent No.: US 11,862,509 B2
(45) Date of Patent: Jan. 2, 2024

(54) SHALLOW TRENCH ISOLATION (STI) STRUCTURE FOR CMOS IMAGE SENSOR

(71) Applicant: OmniVision Technologies, Inc., Santa Clara, CA (US)

(72) Inventors: Seong Yeol Mun, Santa Clara, CA (US); Heesoo Kang, Cupertino, CA (US); Xiang Zhang, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1 day.

(21) Appl. No.: 17/319,368

(22) Filed: May 13, 2021

(65) Prior Publication Data

US 2022/0367245 A1  Nov. 17, 2022

(51) Int. Cl.
*H01L 27/146* (2006.01)
*H01L 21/762* (2006.01)

(52) U.S. Cl.
CPC .... *H01L 21/76224* (2013.01); *H01L 27/1463* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 9,768,220 B2* | 9/2017 | Tseng | H01L 27/14616 |
| 10,573,737 B1* | 2/2020 | Liu | H01L 21/02447 |
| 2004/0164227 A1* | 8/2004 | Ohta | G01J 1/44 |
| | | | 257/E21.551 |
| 2009/0212337 A1* | 8/2009 | Murakoshi | H01L 27/14689 |
| | | | 257/E21.546 |
| 2015/0372034 A1* | 12/2015 | Chen | H01L 27/14614 |
| | | | 257/334 |

* cited by examiner

*Primary Examiner* — Ali Naraghi
(74) *Attorney, Agent, or Firm* — COZEN O'CONNOR

(57) ABSTRACT

A shallow trench isolation (STI) structure and method of fabrication includes forming a shallow trench isolation (STI) structure having a polygonal shaped cross-section in a semiconductor substrate of an image sensor includes a two-step etching process. The first step is a dry plasma etch that forms a portion of the trench to a first depth. The second step is a wet etch process that completes the trench etching to the desired depth and cures damage caused by the dry etch process. A CMOS image sensor includes a semiconductor substrate having a photodiode region and a pixel transistor region separated by a shallow trench isolation (STI) structure having a polygonal shaped cross-section.

15 Claims, 8 Drawing Sheets

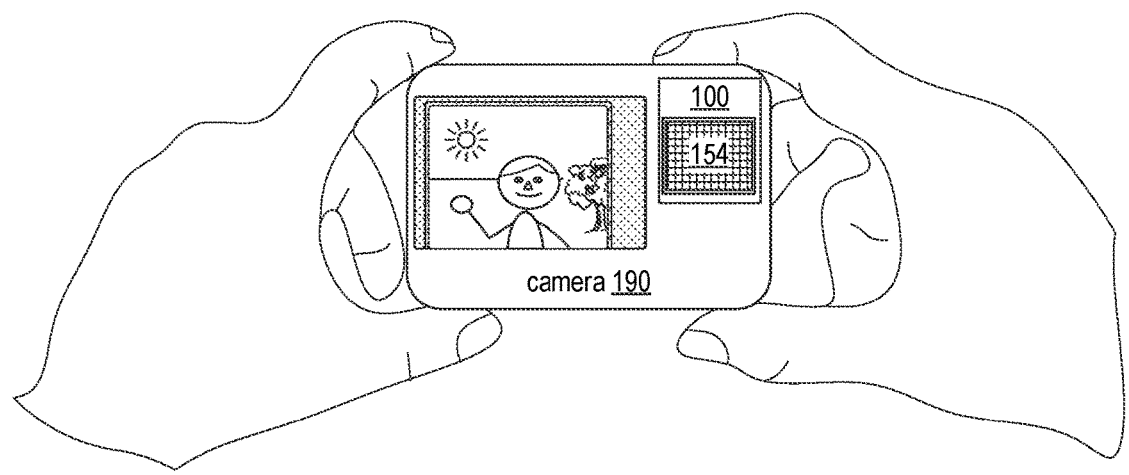
FIG. 1
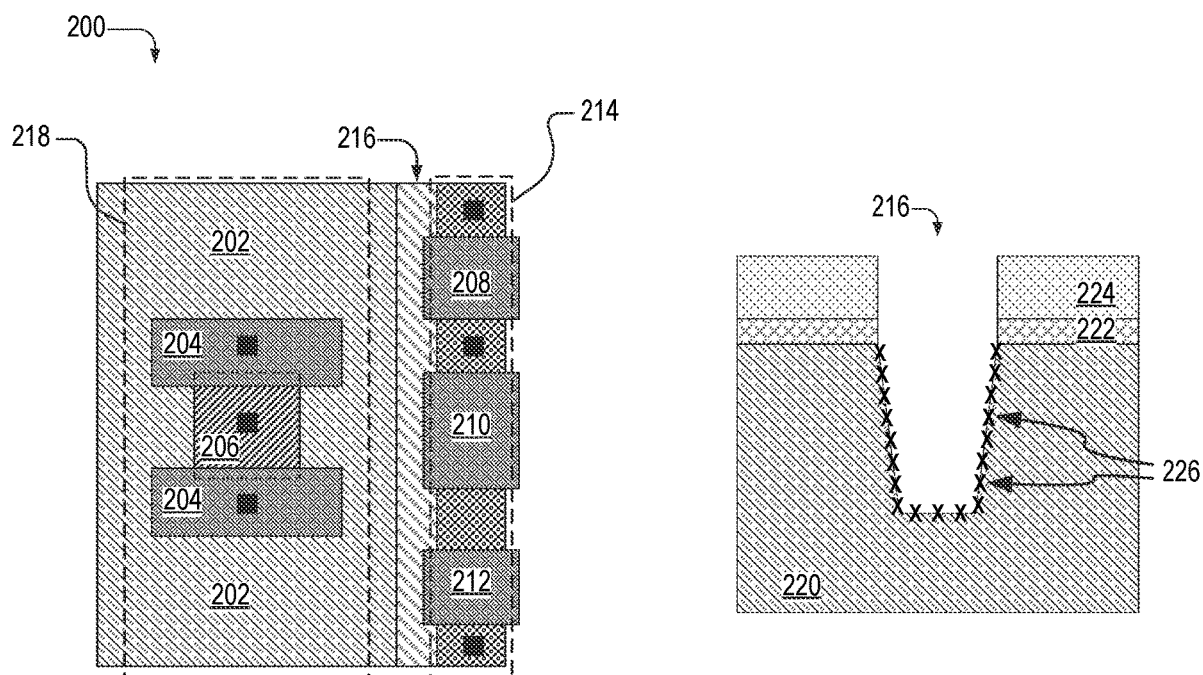
FIG. 2A
FIG. 2B

SHALLOW TRENCH ISOLATION (STI) STRUCTURE FOR CMOS IMAGE SENSOR

BACKGROUND

Wafer-level manufacturing using complementary metal-oxide semiconductor (CMOS) technology has enabled the incorporation of camera modules in many applications including automotive, security and mobile devices. For example, FIG. 1 depicts a camera 190 imaging a scene. Camera 190 includes an image sensor 100, which includes a pixel array 154. In an embodiment, pixel array 154 is an array of individual pixels formed in a semiconductor wafer substrate such as silicon. Similar cameras used in automotive applications include, for example, a back-up camera, as well as front and side cameras.

There is a continuous demand for greater resolution in image sensors, preferably achieved by increasing the number of pixels on a wafer while maintaining the overall image sensor at the same dimension or even smaller. The more pixels in the image sensor, the greater the resolution of an image captured by the image sensor. This can be accomplished both by reducing pixel size so that more pixels may be placed on the wafer or by reducing the space between pixels.

Each pixel in an image sensor includes several devices including, for example, a photodiode and a plurality of transistors. For effective functioning, devices in an image sensor must be electrically isolated from each other. However, as pixel size becomes smaller, device isolation becomes more difficult, particularly with respect to current leakage between devices. Shallow trench isolation (STI) is a semiconductor processing technique of etching trenches in the wafer substrate and filling them with a dielectric to isolate pixels and individual devices within pixels, however, this technique often leads to trap-assisted-tunneling and increased dark current, especially when used in high temperature environments such as those frequently found in automotive applications.

FIG. 2A shows a plan view of a pixel 200 of image sensor 100 formed in a semiconductor substrate. Photodiodes 202, transfer transistors 204 and a floating diffusion node 206 are formed in a photodiode region 218 of the substrate having a first conductive type, e.g. N-type. Reset transistor 208, source-follower transistor 210 and row select transistor 212 are formed in a pixel transistor region 214 of the semiconductor substrate having a second conductive type, e.g. P-type, opposite to the first conductive type. Photodiode 202 in photodiode region 218 and transistors in pixel transistor region 214 are to be electrically isolated from each other. Shallow trench isolation (STI) structure 216 isolates photodiode region 218 from pixel transistor region 214. FIG. 2B is cross-sectional view STI structure 216 as formed in the semiconductor substrate 220 by a process of plasma etching, for example, etching through a pad oxide layer 222 and a pad nitride layer 224 forming a trench isolation structure. Plasma dry etching often causes damage to crystal lattice of leaving silicon (Si) dangling bonds 226 on the sidewalls and bottom of the trench of STI structure 216. For clarity of illustration, not all Si dangling bonds 226 are labeled with a reference numeral in FIG. 2B.

An STI structure 216 provides a robust isolation margin without dopant diffusion induced side effects. However, dangling bonds 226 formed along the trench sidewall or between a silicon dioxide and silicon interface form trap sites that trap electrons or holes during imaging operation, thus generating current inside or near the photodiode 202 of individual pixels and contributing to dark current or electrical current generated in photodiode 202 in absence of incident light.

Another method of isolating photodiode region 218 from pixel transistor region 214 uses implant isolation (e.g., a P-type isolation well) instead of an STI structure 216. FIG. 3 depicts the pixel of FIG. 2A with a boron implanted area 228 in the semiconductor substrate 220 separating photodiode region 218 from pixel transistor region 214 instead of STI structure 216. However, using boron ion-implantation to isolate devices in a pixel also creates issues. These include high lateral diffusion of boron atoms into areas of the semiconductor substrate 220 in which counter-doped photodiode doping area lowers the full well capacity (FWC) decreasing photodiode sensitivity and dynamic range of associated pixels, in photodiode areas arranged adjacent to the boron ion-implantation area. It also degrades the isolation resolution and causes high junction leakage by an abrupt p-n junction transistor, such as a boron to N+ junction transition.

SUMMARY OF THE EMBODIMENTS

In a first aspect, a shallow trench isolation (STI) structure formed in a semiconductor substrate having a front-side surface to provide isolation between a photodiode region and a pixel transistor region, the STI structure including a trench having sloped walls and a polygonal shaped cross-section wherein a width of the trench varies along the depth of the trench from a first width W to a second width W1 larger than first width W at a second depth D1 then to a third width W2 smaller than the first width W at the first depth D; wherein the first depth D is greater than the second depth D1 with respect to the front-side surface; and a dielectric material filing the trench.

In a second aspect, a method of forming a shallow trench isolation (STI) structure having a polygonal shaped cross-section in a semiconductor substrate of an image sensor includes a two-step etching process. The first step is a dry plasma etch that forms a portion of the trench. The second step is a wet etch process that completes the trench etching and cures damage caused by the dry etch process.

In a third aspect, a CMOS image sensor includes a semiconductor substrate having a photodiode region and a pixel transistor region separated by a shallow trench isolation (STI) structure having a polygonal shaped cross-section. In embodiments, the cross-section may be diamond shaped.

BRIEF DESCRIPTION OF THE FIGURES

FIG. 1 depicts a camera that includes an image sensor, in an embodiment.

FIG. 2A is a schematic plan view of a pixel layout for an image sensor using shallow trench isolation.

FIG. 2B is a cross-sectional view of a trench etched in a semiconductor substrate.

DETAILED DESCRIPTION OF THE EMBODIMENTS

Figure 3:
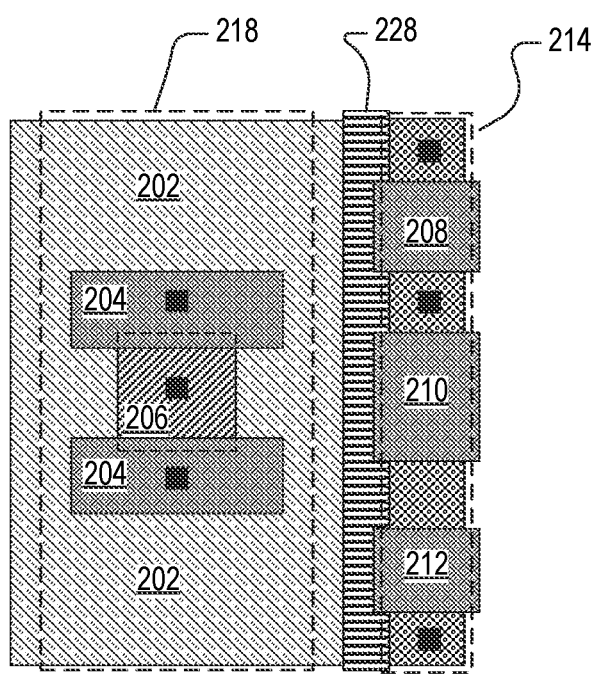
FIG. 3 is a schematic plan view of a pixel layout for an image sensor using implant isolation.
Figure 4A:
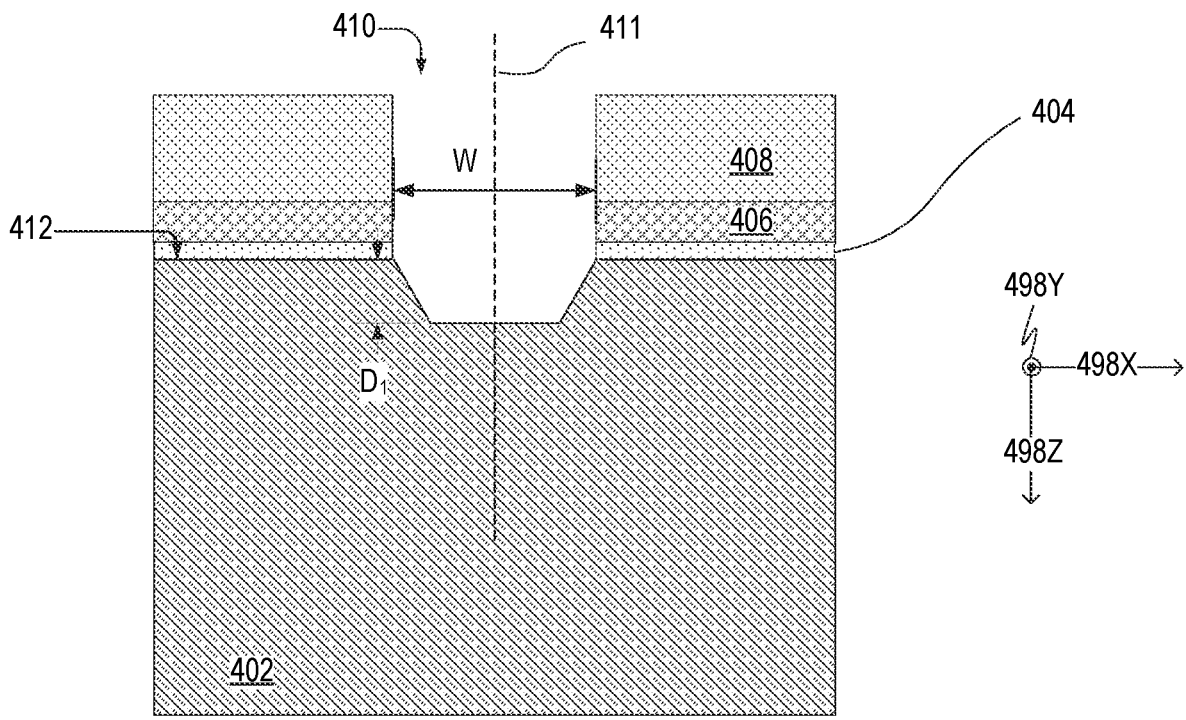
FIG. 4A is a cross-sectional view of a first step in fabrication of an STI structure, according to an embodiment.
Figure 4B:
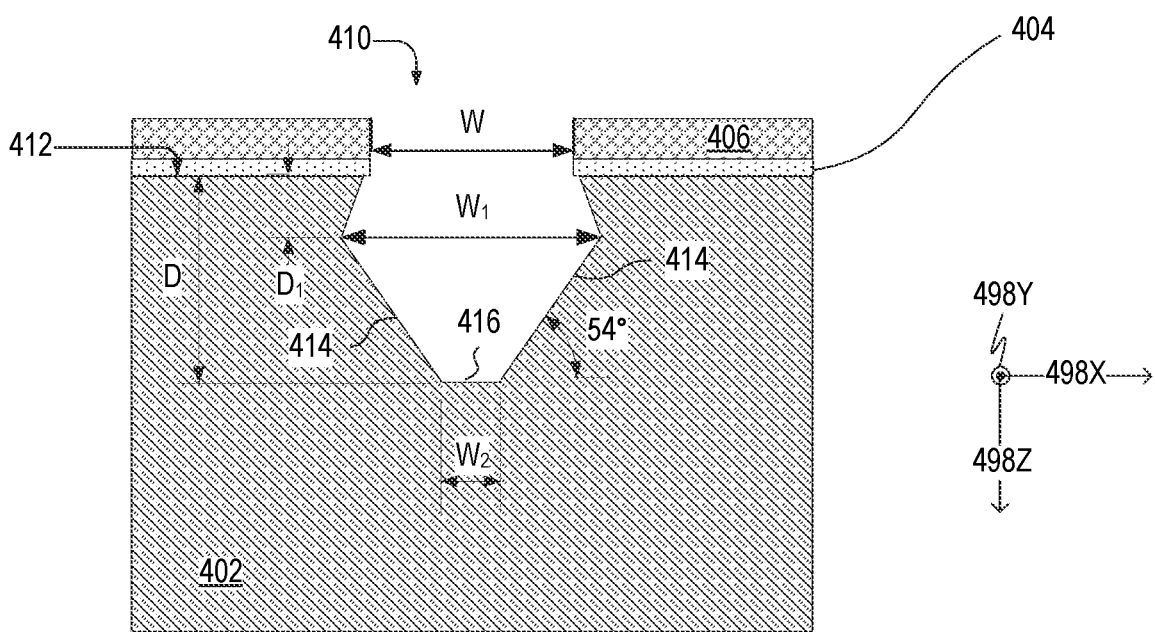
FIG. 4B is a cross-sectional view of a subsequent step in fabrication of an STI structure, according to an embodiment.
Figure 4C:
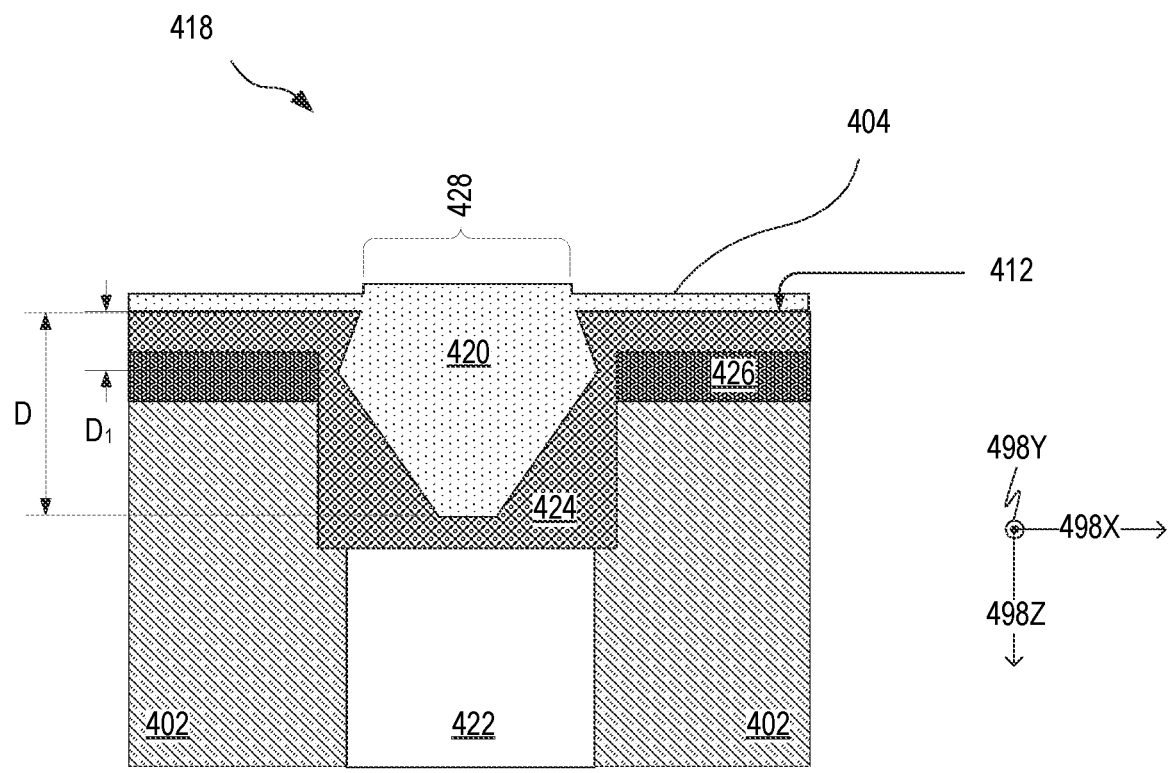
FIG. 4C is a cross-sectional view of an STI structure, according to an embodiment.

In embodiments, shallow trench isolation (STI) structures with a width, typically referred to as a critical dimension (CD) and a target depth (TD) may be formed in a wafer substrate. STI formation in the wafer substrate is typically performed prior to fabrication of photodiodes, transistors and other devices in the substrate. The CD of STI structures significantly impacts the density of pixels on the wafer substrate and therefore, the performance of the image sensor. FIGS. 4A-4C depict several stages in the formation of an STI structure having a width W corresponding to CD and a depth D corresponding to TD, according to embodiments. The cross-sectional schematics of FIGS. 4A-4C are each parallel to a plane, hereinafter the x-z plane, formed by orthogonal directions 498X and 498Z, which are each orthogonal to direction 498Y. FIGS. 4A-4C are best viewed together in the following description.

Prior to STI structure fabrication, semiconductor substrate 402 may be coated with a pad oxide layer 404, a pad nitride layer 406 and photoresist layer 408 sequentially deposited. In embodiments, an N-/P type P-Well implant (not shown) may be fabricated in semiconductor substrate 402. In an embodiment, semiconductor substrate 402 is formed from silicon, although other semiconductor materials may be used, for example, bulk silicon substrate doped with n-type or p-type dopants, silicon on insulation (SOI) substrate, silicon germanium, and the like. As patterned using a lithography process with photoresist layer 408, trench 410 is etched into semiconductor substrate 402 through pad nitride layer 406 and pad oxide layer 404 to a depth $D_1$ in semiconductor substrate 402. In an embodiment, depth $D_1$ refers to the depth or distance into the semiconductor substrate 402 from planar surface 412 of semiconductor substrate 402. Planar surface 412 may be a front side surface of semiconductor substrate 402 or a substrate top surface of semiconductor substrate 402, for brevity, planar surface 412 or surface 412 will be used interchangeably hereinafter. Planar surface 412 is parallel to the x-y plane formed by 498X and 498Y, and perpendicular to direction 498Z and depths described herein in relation to direction 498Z.

In an embodiment, etching is performed using a dry plasma etch to remove a portion of substrate material to create a trench 410 having depth $D_1$ ranging from approximately 10 nm to 60 nm and a width W approximately equal to the preferred STI structure CD. In embodiments, width W may range from approximately 0.1 μm to 0.2 μm. A larger CD is also contemplated. In embodiments, isotropic dry etching parameters depend on the material of semiconductor substrate 402 and include pressure, gas composition (e.g., oxygen $O_2$, fluorine, $SF_6$, $CF_4$, $CHF_3$, $C_4F_8$), gas generation or injection method, and generator power. After the dry etch process, photoresist layer 408 is removed, for example by a strip and clean process.

Plasma etching damages the walls of trench 410 leaving dangling bonds, or trap sites that contribute to dark current noise affecting image quality. To remove plasma-induced damage, the dry plasma etching process forming the trench 410 having depth $D_1$ is followed by a wet etch process, as shown in FIG. 4B. A wet etching process does not use the high energy ion bombardment as does the dry etch process. In embodiments, a wet etch process using KOH/IPA (potassium hydroxide/isopropyl alcohol) is performed. Parameters of etchant concentration, temperature and time are chosen to perform an etching process until trench 410 reaches a depth D as measured from planar surface 412 of semiconductor substrate 402. In an embodiment, D ranges from approximately 120 nm to approximately 150 nm.

In embodiments, trench 410 has a trench profile with a polygonal shaped cross-section in the plane formed by orthogonal directions 498X and 498Z. For example, trench 410 may have a trench profile that is generally hexagonal-shaped. In embodiments, sidewalls 414 of trench 410 are symmetrical with respect to the vertical central line 411 of trench 410. For clarity of illustration, vertical central line is only shown in FIG. 4A.

In an embodiment, semiconductor substrate 402 is formed of crystalline silicon that has a surface orientation of <100>. The anisotropic etching characteristics of silicon result in the polygonal shaped cross-section of FIG. 4B with smoother sidewall and bottom surfaces. In embodiments, etching parameters are selected so sidewalls 414 of trench 410 form an angle of approximately 54 degrees with bottom 416 of trench 410 and a preferred depth of D is reached. In embodiments, the bottom 416 of trench 410 has a surface orientation of <100> and sidewalls 414 have a surface orientation of <111>. The wet etching process results in a trench with a width W at planar surface 412, widening to a width $W_1$ at depth $D_1$ then narrowing to width $W_2$ at depth D. In embodiments, $W_1$ is determined by depth difference between depth D and $D_1$ ($D-D_1$) based on etching parameter (e.g. etching angle at 54° degrees) and bottom width $W_2$ (which is approximately 40 nm).

A wet etch process has very good selectivity to create trench 410 with a polygonal, or diamond shaped cross section. A wet etch alone may not be successful if, for example, there is some residue (e.g., oxide material) on surface 412 of semiconductor substrate 402. This residue may result in a cavity that is not opened properly, a premature end to the etch process or residue material inside the cavity, for example. Opening the trench 410 with a dry etch process removes residue material before the wet etch process is performed. After etching, trench 410 may be subjected to surface treatment processes to remove some Si defects and reduce humidity at the trench surface, for example, Siconi™ and hydrogen bake. Siconi™ is a soft dry chemical etching process (e.g. plasma) that may selectively remove oxidized silicon surface defects by exposing the region to be etched to etching agents such as $H_2$, $HF_3$ and $NH_3$. Hydrogen bake is the subsequent surface clearing process used to remove oxide present on the silicon interface. These processes, however, do not remove all Si dangling bonds created by etching.

FIG. 4C is a cross-sectional view of an STI structure 418 after subsequent processing steps. Trench 410 is filled with a dielectric material 420 such as oxide material using, for example, a high aspect ratio process (HARP) to deposit dielectric material into trench 410, although other processes, such as chemical vapor deposition process may be used. In embodiments, dielectric material 420 is the same material as pad oxide layer 404. In embodiments, pad nitride layer 406 is subsequently removed by, for example, a chemical mechanical polishing (CMP) process although other processes may be used. The deposition process may create a small protrusion 428 of dielectric material above trench 410 and above planar surface 412. Protrusion 428 may protect STI structure 418 from over etching during a subsequent CMP process. In embodiments, protrusion 428 prevents exposure of corner 320 of STI structure 418 minimizes time-dependent dielectric breakdown (TDDB) failure and improves reliability of a device (e.g., an image sensor device) incorporating STI structure 418.

In embodiments, STI structure 418 is disposed in a P-type doped well region 422. In embodiments, P-type doped well region 422 is an ion-implanted well region of P-type in the semiconductor substrate 402 or a P-type doped epitaxial layer grown on semiconductor substrate 402. STI structure 418 and P-type doped well region 422 provide electrical isolation between adjacent photodiode region and pixel transistor region. In embodiments, the P-type doped well region 422 has at least one device or pixel transistor e.g., source follower, reset transistor, row-select transistor formed therein. In embodiments, STI structure 418 is further passivated by implantation forming a doped region 424 having opposite conductive type (e.g., boron-doped region) to photodiode region (not shown) to passivate sidewalls 414 of STI structure 418 and provide isolation between nearby photodiodes(not shown) and source/drains of device or pixel transistors. Doped region 424 surrounding STI structure 418 may be conformally formed along sidewalls and bottom surface of 414. Restated, doped region 424 may be implanted to surround the STI structure 418. In embodiments, the concentration of doped region 424 may be higher than the P-type doped well region 422 for example by at least one order of magnitude. In embodiments, the concentration of doped region 424 is higher than the semiconductor substrate 402, for example by at least one order of magnitude. In embodiments, a surface pinning region 426 is formed between substrate top surface 412 of semiconductor substrate 402 and photodiode region (not shown) to passivate surface defects and reduce dark current. In embodiments, P-type doped well region 422, the doped region, surface pinning region 426 are coupled to a ground.

Figure 5:
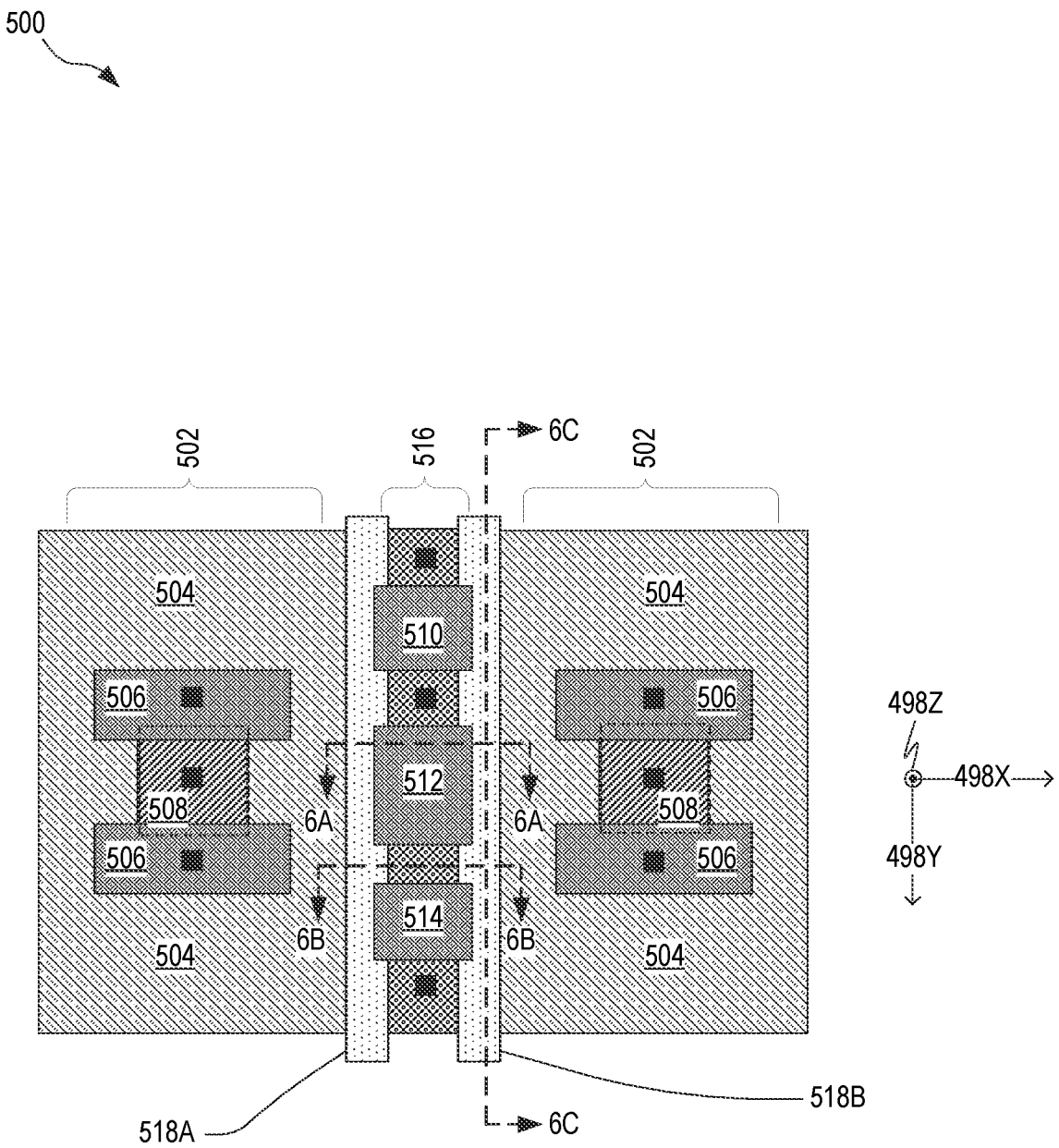
FIG. 5 shows a plan view of adjacent pixels in an image sensor, according to an embodiment.
Figure 6A:
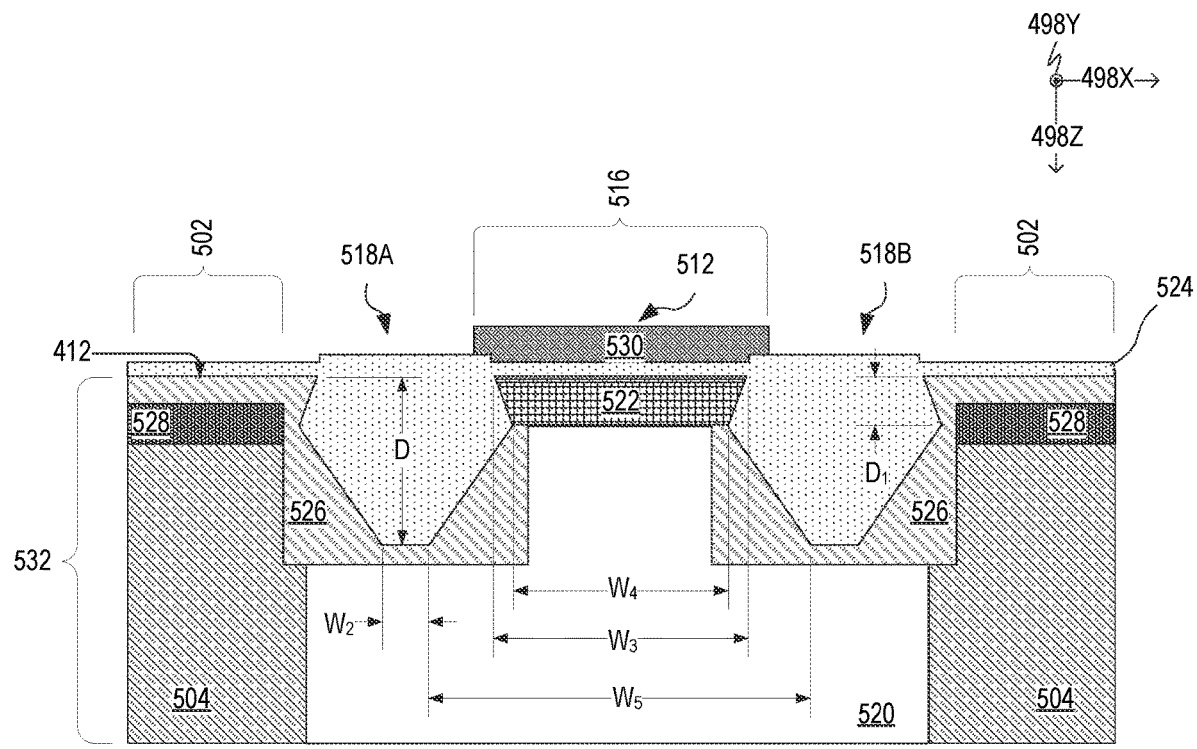
FIG. 6A is a cross-sectional view along line 6A-6A of FIG. 5, according to an embodiment.
Figure 6B:
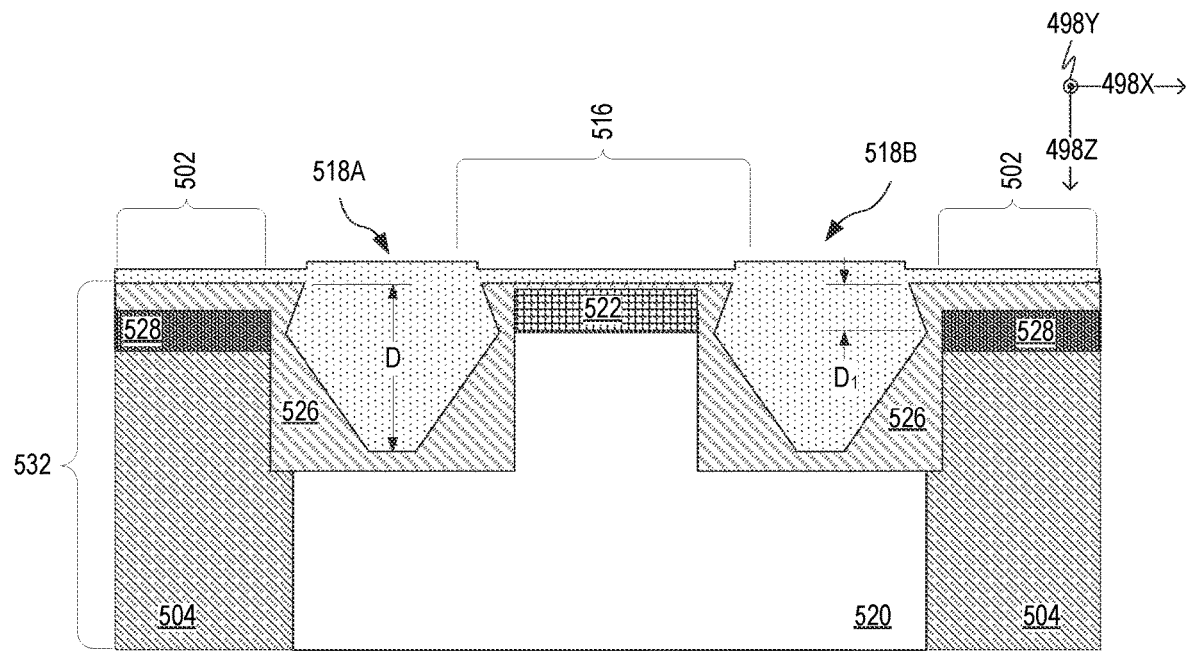
FIG. 6B is a cross-sectional view along line 6B-6B of FIG. 5, according to an embodiment.
Figure 6C:
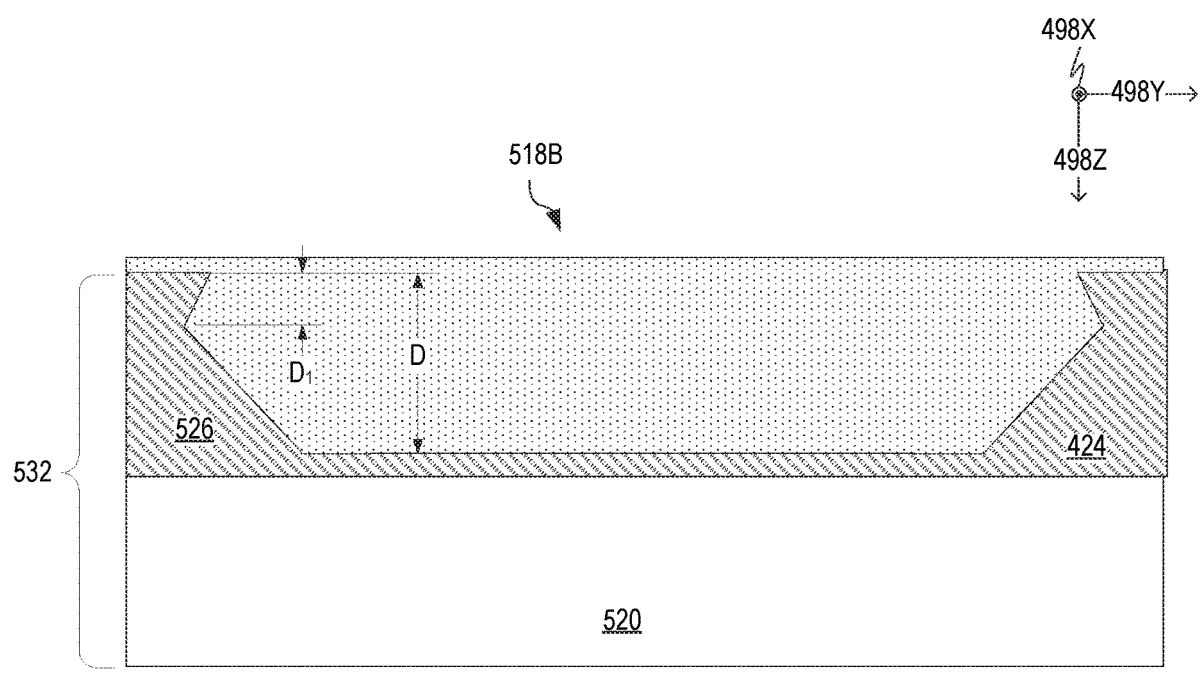
FIG. 6C is a cross-sectional view along line 6C-6C of FIG. 5, according to an embodiment.

FIG. 5 shows a plan view of adjacent photodiode regions 502 in a pixel cell 500. FIG. 6A is a cross-sectional view along line 6A-6A of FIG. 5. FIG. 6B is a cross-sectional view along line 6B-6B of FIG. 5. FIG. 6C is a cross-sectional view along line 6C-6C of FIG. 5. FIGS. 5 and 6A-6C are best viewed together in the following description. The plan view of FIG. 5 is in the plane formed by orthogonal directions 498X and 498Y, which are each orthogonal to direction 498Z.

In FIG. 5, photodiodes 504, transfer transistors 506 and floating diffusion nodes 508 are formed in photodiode regions 502 (also referred to as active regions or photosensing regions) of a wafer substrate (or a semiconductor substrate). Photodiodes 504 and floating diffusion nodes 508 are doped regions having a first conductive type, e.g. N-type in the wafer substrate, and the wafer substrate is configured to have a second conductive type e.g., P-type, opposite to the first conductive type. In embodiments, transfer transistors 506 couple their respective photodiode 504 to the respective floating diffusion node 508, and selectively transfer photogenerated charges from respective photodiode 504 to floating diffusion node 508 in response to a transfer signal received at respective transfer gate 506. Each of photodiodes 504 functions as a source region to the respective transfer transistor 506, and each of floating diffusion nodes 508 functions as a drain region to respective transfer transistor 506. Although not illustrated, in embodiments, floating diffusion nodes 508 are coupled to reset transistor 510 and source-follower transistor 512 through metal contacts and metal interconnects the source-follower transistor 512 is coupled to the row select transistor 514. The row select transistor 514 is coupled to a bitline (not shown) through metal contacts and metal interconnects. In embodiments, reset transistor 510, source-follower transistor 512 and row select transistor 514 are N-channel transistors formed in pixel transistor region 516 of the wafer substrate. Pixel transistor region 516 is in between the adjacent pixel cells. In this example, source and drain regions of the reset transistor 510, source-follower transistor 512 and row select transistor 514 are N-type doped regions i.e. doped regions of the first conductive type opposite to the second conductive type of the wafer substrate. Photodiodes 504 in photodiode regions 502 are electrically isolated from pixel transistor region 516 by STI structures 518A, 518B, respectively in the wafer substrate. STI structures 518A and 518B may be understood as corresponding to STI structure 418 as shown in FIG. 4C. In embodiments, reset transistor 510, source-follower transistor 512 and row select transistor 514 are associated with one of the photodiode regions 502.

For simplicity, two photodiodes per unit pixel are illustrated in FIG. 5. In other embodiments, a pixel may include more or fewer photodiodes. Similarly, the illustrated pixel layout demonstrates a "four-transistor configuration," that is, the pixel transistors for each respective pixel include a transfer transistor, reset transistor, source follower transistor, and row select transistor. In some embodiments, a pixel may be configured to a "three-transistor configuration" and include only a transfer transistor, a reset transistor, and a source follower transistor. In some embodiments, a pixel may be configured to a "five transistor configuration" and include a transfer transistor, a row select transistor, a source follower transistor, a reset transistor (and an overflow transistor or a dual floating diffusion (DFD) transistor. Thus, number of photodiodes in a pixel and the number of pixel transistors used for controlling operation of the pixel may depend on configuration of the respect pixel.

FIGS. 6A-6C are cross-sectional views along three sections of pixel cell 500 of FIG. 5. The schematics of FIGS. 6A-6B are each parallel to a plane, hereinafter the x-z plane, formed by orthogonal directions 498X and 498Z, which are each orthogonal to direction 498Y. The schematic of FIG. 6C is parallel to a plane, hereinafter the y-z plane, formed by directions 498Y and 498Z. FIGS. 6A-6C are best viewed together in the following description.

FIG. 6A is a cross-sectional view along line 6A-6A of FIG. 5 across source-follower transistor 512. A similar cross-section would be found across reset transistor 510, or row select transistor 514. Source-follower transistor 512 in pixel transistor region 516 is isolated from photodiodes 504 in photodiode regions 502 by STI structures 518A and 518B. Gate oxide layer 524 separates gate 530 of source-follower transistor 512 from source/drain 522, formed in well region 520 in a semiconductor substrate 532 (e.g., silicon substrate or bulk substrate). In embodiments, at least a part of gate 530 of source-follower transistor 512 is disposed on the STI structures 518A and STI structure 518B, that is gate 530 of the source-follower transistor 512 partially overlaps STI structures 518A, 518B. In embodiments, the shape of the part of gate 530 that overlaps STI structure 518A and STI structure 518B is conformal to the shape or profile of dielectric material protrusion of STI structures 518A and 518B as illustrated in FIG. 6A. Well region 520 is formed by implantation of second conductivity type (e.g., p-type) impurities into substrate while source/drain 522 is formed by implantation of first conductivity type (e.g., n-type) impurities. Doped region 526 may provide additional passivation and isolation between STI structure 518A, 518B and nearby photodiodes 504, as well as between source/drains 522 of pixel transistors (e.g., reset transistor, source-follower or row-select transistor) in pixel transistor region 516. In embodiments, doped region 526 is implanted with Boron ions. In embodiments, each photodiode 504 is an n-type region and includes a P-type pinning region 528 between substrate 532 surface 412 and photodiode 504. P-type pinning region 528 passivates planar surface 412 defects and gives better isolation between substrate surface and a respective photodiode 504, thereby reducing dark current.

In embodiments, each of STI structures 518A and 518B have a polygonal shaped cross-section, for example a diamond shaped cross-section, along direction 498X. First vertices of the polygonal shaped cross-section are at a depth $D_1$ with respect to surface 412 of semiconductor substrate 532. Depth $D_1$ is approximately 10-60 nm corresponding to the first step of dry etching. STI structures 518A and 518B have an overall depth D from surface 412 of semiconductor substrate 532 of approximately 120-150 nm corresponding to the second step of wet etching. In embodiments, depth D of each of STI structures 518A and 518B is greater than a junction depth of source/drain 522 of associated pixel transistor (e.g., source-follower transistor 512). In embodiments, the junction depth of source/drain 522 of associated pixel transistor may be 70-80 nm. The polygonal shaped cross-section also has the effect of varying the spacing between STI structures 518A and 518B along their depth.

Proximate to planar surface 412 of semiconductor substrate 532, the spacing between STI structure 518A is width $W_3$ (first separation width). At depth $D_1$, the spacing narrows or decreases to width $W_4$ (second separation width). At depth D from planar surface 412, the spacing between STI structures 518A and 518B widens or increases to width $W_5$ (third separation width). In embodiments, width $W_5$ (third separation width) is greater than width $W_3$ (first separation width), and width $W_3$ (first separation width) is greater than width $W_4$ (second separation width).

FIG. 6B is a cross-sectional view along line 6B-6B of FIG. 5. Although FIG. 6B depicts a cross-sectional view between transistors between 512 and 514, a similar cross-section would be found in similar areas of pixel transistor region 516. Each of STI structure 518A and 518B has the same diamond shaped cross section at the same depths $D_1$ and D. Source/drain 522 of associated pixel transistor (e.g., source-follower transistor 512) extends along the length of pixel transistor region 516 in the direction 498Y.

FIG. 6C is a cross-sectional view along line 6C-6C of FIG. 5. As shown in FIG. 6C, each of STI structures 518A and 518B also has an extended polygonal shaped cross-section, for example a diamond shaped profile, along direction 498Y, providing effective electrical isolation between photodiodes in photodiode region and pixel transistors in pixel transistor region. In embodiments, the length of STI structure 518 in direction 498Y is at least the same as the length of photodiode region 502 in direction 498Y.

Figure 7:
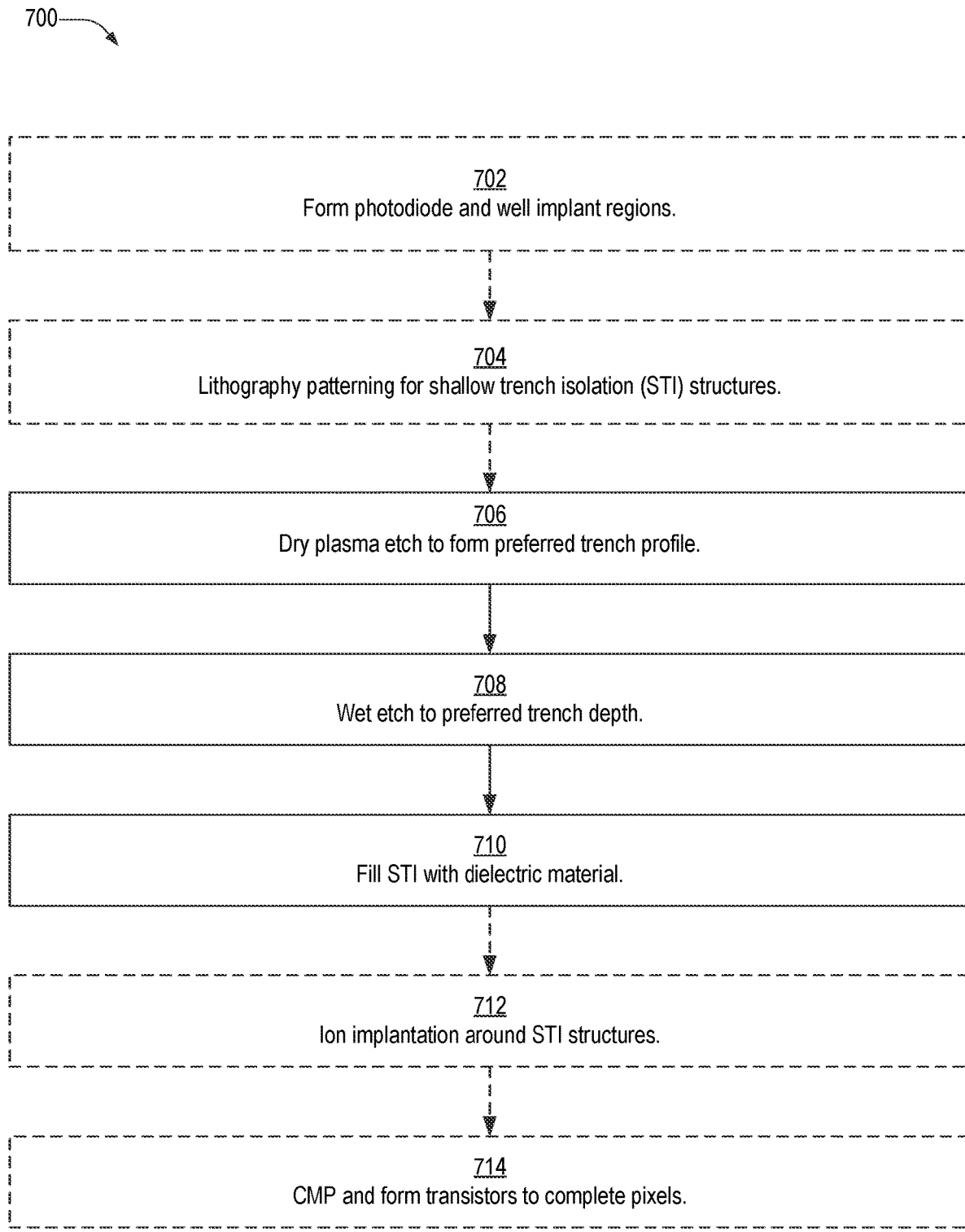
FIG. 7 is a flowchart illustrating a method for fabricating an STI structure in a wafer substrate of an image sensor according to an embodiment.

FIG. 7 is a flowchart illustrating a method 700 for fabricating an STI structure in a semiconductor or wafer substrate of an image sensor. Method 700 includes steps 706, 708 and 710. In embodiments, method 700 also includes at least one of steps 702, 704, 712 and 714.

Step 702 includes forming a plurality of photodiodes and well implant regions in a semiconductor substrate. Photodiodes and well implant regions are implanted into a front surface of the semiconductor substrate by patterning and ion implantation. Photodiodes and well regions have opposite conductive type. In an example of step 702, photodiodes are formed by implanting N-type dopants e.g., phosphorus or arsenic, into the semiconductor substrate 402 of P-type from planar surface 412 of the semiconductor substrate 402 forming N-type diffusion regions of photodiodes. Well regions are formed by implantation P-type dopants e.g., boron, into the semiconductor substrate 402 from planar surface 412 of the semiconductor substrate 402. In another example, photodiodes are doped regions formed by implanting P-type dopants e.g., boron, into the semiconductor substrate 402 of N-type from planar surface 412 of the semiconductor substrate 402 forming P-type diffusion regions of photodiodes and well regions are formed by implantation N-type dopants e.g., phosphorus or arsenic, into the semiconductor substrate 402 from planar surface 412 of the semiconductor substrate. In some embodiments, well implant regions may be formed before the formation of photodiodes.

Step 704 includes lithography patterning onto the semiconductor substrate with regions for one or more shallow trench isolation structures. In an example of step 704, region of one or more STI structures are patterned onto semiconductor substrate 402 using a photoresist layer 408 with a lithography process.

Step 706 includes a dry plasma etch to form a trench having a first trench profile at a first depth. In an example of step 706, photoresist layer 408 defines areas in semiconductor substrate 402 for a dry plasma etch through pad nitride layer 406, pad oxide layer 404 and into semiconductor substrate 402 to form trench 410 with a depth of approximately 50 nm, although the depth may range from approximately 10-60 nm. Step 706 defines a trench width W (first trench width) at planar surface 412 of semiconductor substrate 402 and a depth $D_1$ in semiconductor substrate 402 with respect to the planar surface 412 and provides an etching path to the trench in the semiconductor substrate preventing surface material residue forming a blockage and affecting overall etching performance.

Step 708 includes a wet etch to etching through the trench (first trench) to a depth D with a second trench having width $W_1$ (second trench width) at depth $D_1$ and a width $W_2$ (third trench width) at depth D, where depth D is greater than depth $D_1$ with respect to planar surface 412. In an example of step 708, a silicon wet etch with KOH/IPA (potassium hydroxide/isopropyl alcohol) is performed until trench 410 reaches a depth D of approximately 120-150 nm. Depth D can be controlled exactly and constantly according to the length of time and other parameters of the wet etch. In an example, the wet etch process forms a diamond shaped trench profile wherein trench 410 has a base width $W_2$ of approximately 40 nm.

Using a wet etching (anisotropic etching) process after the dry etching (e.g., plasma etching) process to form trench for STI structure can remove etching damage caused by initial dry etching of step 706, and yield a trench for STI structures such as STI structures 518A, 518B with smoother sidewall surfaces, thus greatly reducing the number of trap sites at the interface between the sidewalls of the STI structure 518A, 518B and the semiconductor substrate, therefore minimizing the dark current issue associated with STI structure 216 as shown in FIG. 2B.

Step 710 includes filling the etched STI trench structure with a dielectric material. In an example of step 710, trench 410 is filled with an oxide material using a high aspect ratio process (HARP), although other processes may be used.

Step 712 includes ion implantation around STI structures. In an example of step 712, boron ions are implanted in doped region 424 surrounding sidewalls of STI structure 418 to enhance the isolation capabilities of STI structure 418 as shown in FIG. 4C. In another example of step 712, boron ions are implanted in doped region 526 surrounding sidewalls of STI structures 518A, 518B to enhance the isolation capabilities of STI structure 518A, 518B between photodiodes and source/drain regions of pixel transistors as shown in FIG. 6A.

Step 714 includes chemical mechanical polishing (CMP) and forming transistors to complete pixels. In an example of step 714, pad nitride layer 406 is removed using CMP and with subsequent processes e.g., gate formation and source/drain, floating diffusion implantation, additional structures of an image sensor are formed as shown in FIG. 5.

Combinations of Features

Features described above as well as those claimed below may be combined in various ways without departing from the scope hereof. The following enumerated examples illustrate some possible, non-limiting combinations:

(A1) A shallow trench isolation (STI) structure formed in a semiconductor substrate having a front-side surface, the STI structure having a first width W in the same plane as the front-side surface and a first depth D perpendicular to the front-side surface, to provide isolation between a photodiode region comprising a photodiode and a pixel transistor region comprising at least one transistor, the STI structure includes a trench formed in the front-side surface such that the trench extends into the semiconductor substrate to the first depth D relative to the front-side surface, said trench comprising sloped walls and a polygonal shaped cross-section between the photodiode region and the pixel transistor region, wherein a width of the trench varies along the depth of the trench from a first width W to a second width W1 larger than first width W at a second depth D1 then to a third width W2 smaller than the first width W at the first depth D; wherein the first depth D is greater than the second depth D1 with respect to the front-side surface; and a dielectric material filing the trench.

(A2) In STI structure (A1), the first depth D is approximately 120-150 nm.

(A3) In STI structure (A1) or (A2), the second depth D1 is approximately 10-60 nm.

(A4) In any of STI structures (A1)-(A3), the polygonal shaped cross section of the trench between the photodiode region and the pixel transistor region is diamond shaped.

(A5) In any of STI structures (A1)-(A4), the trench has an extended polygonal shaped cross-section parallel to a length direction of photodiode region.

(A6) In any of STI structures (A1)-(A5), further including a boron-doped area in said semiconductor substrate surrounding said STI structure.

(B1) A method of forming a shallow trench isolation (STI) structure in a semiconductor substrate having a front-side surface and a first depth D extending from the front-side surface, the STI structure formed between a photodiode region and a pixel transistor region, defined in the semiconductor substrate, the method includes dry etching a trench to a second depth D1 in the semiconductor substrate with respect to the front-side surface, the trench having a first width W at the front-side surface of the semiconductor substrate; wet etching through the trench to have sloped walls and a polygonal shaped cross-section between the photodiode region and the pixel transistor region, the polygonal shaped cross-section of the trench comprising the first width W at the front-side surface, a second width W1 at the second depth D1 and a third width W2 at the first depth D wherein W1>W>W2 and wherein D>D1; and filling the etched trench with a dielectric material.

(B2) In the method of (B1), dry includes forming an oxide layer on the semiconductor substrate; forming a nitride layer on the semiconductor substrate; depositing a photoresist layer on the nitride layer that is patterned with the trench to be etched with a lithography process; and dry etching the trench into the semiconductor substrate through the nitride layer and the oxide layer to the second depth D1.

(B3) In the method of (B1) or (B2), wet etching further comprises a wet etch using KOH/IPA (potassium hydroxide/isopropyl alcohol) for a period of time until the trench reaches the first depth D.

(B4) In any of methods (B1)-(B3), the dielectric material is an oxide material.

(B5) In any of methods (B1)-(B4), wet etching through the trench includes etching through the trench to have sloped walls and a polygonal shaped cross-section that is diamond shaped between the photodiode region and the pixel transistor region.

(B6) In any of methods (B1)-(B5), further including forming a doped region in the semiconductor substrate in an area surrounding the trench, wherein forming a doped region comprises implanting boron ions around sidewalls of the trench to form the doped region having a doping concentration higher than the semiconductor substrate.

(C1) A CMOS image sensor formed in a semiconductor substrate having a front-side surface includes a first photodiode region comprising at least one photodiode; a pixel transistor region comprising at least one transistor having a gate on the front-side surface and a source/drain in the semiconductor substrate adjacent to the gate; and a first shallow trench isolation (STI) structure comprising a first trench filled with a dielectric material, the first trench having a first depth D formed in the front-side surface to provide isolation between the first photodiode region and the pixel transistor region, said first trench further comprising sloped walls and a polygonal shaped cross-section between the first photodiode region and the pixel transistor region, wherein a width of the first trench varies along a depth of the first trench in the semiconductor substrate from a first width W at the front-side surface to a second width W1 larger than the first width W at a second depth D1 then to a third width W2 smaller than the first width W at the first depth D, wherein the first depth D is greater than the second depth D1 with respect to the front-side surface.

(C2) In the sensor of (C1), further including a second photodiode region comprising at least one photodiode; and a second STI structure disposed between the second photodiode region and the pixel transistor region and spaced from the first STI structure, the second STI structure comprising a second trench having the first depth D filled with a dielectric and having another polygonal shaped cross-section between the second photodiode region and the pixel transistor region; wherein the pixel transistor region is disposed between the first STI structure and the second STI structure; wherein a spacing between the first STI structure and the second STI structure varies along the depths of the first STI structure and the second STI structure; where the spacing at the front-side surface has a first separation width, decreases to a second separation width at the second depth D1 and increases to a third separation width at the first depth D.

(C3) In the sensor of (C3), the gate of the at least one transistor partially overlaps the first and the second STI structures.

(C4) In either of the sensors of (C2) or (C3), the at least one photodiode in each of the first and second photodiode regions comprises a doped region having a first conductive type, the CMOS image sensor further includes a well region of second conductive type opposite to the first conductive type disposed in the semiconductor substrate, wherein the first and the second STI structures are disposed in the well region.

(C5) In any of the sensors of (C2)-(C4), a junction depth of the source/drain is less than the first depth D of the first STI structure and the second STI structure.

(C6) In any of the sensors of (C2)-(C5), each of the first and second trenches has an extended polygonal shaped cross-section parallel to a length direction of photodiode region.

(C7) In any of the sensors of (C1)-(C6), wherein the first depth D is approximately 120-150 nm.

(C8) In any of the sensors of (C1)-(C7), the second depth D1 is approximately 10-60 nm.

(C9) In any of the sensors of (C1)-(C8), further comprising a boron-doped area in said semiconductor substrate surrounding said first STI structure.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A shallow trench isolation (STI) structure formed in a semiconductor substrate having a front-side surface, the STI structure having a first width W in the same plane as the front-side surface and a first depth D perpendicular to the front-side surface, to provide isolation between a photodiode region comprising a photodiode and a pixel transistor region comprising at least one transistor, the STI structure comprising:
a trench disposed on the front-side surface such that the trench extends into the semiconductor substrate to the first depth D relative to the front-side surface, said trench having a hexagonal shaped cross-section in the semiconductor substrate between the photodiode region and the pixel transistor region, wherein a width of the trench varies along the depth of the trench from a first width W at the front-side surface to a second width $W_1$ larger than first width W at a second depth $D_1$ relative to the front-side surface, then to a third width $W_2$ smaller than the first width W at the first depth D; wherein the first depth D is greater than the second depth $D_1$ with respect to the front-side surface; and
a dielectric material filing the trench.

2. The STI structure of claim 1, wherein the first depth D is approximately 120-150 nm.

3. The STI structure of claim 1, wherein the second depth $D_1$ is approximately 10-60 nm.

4. The STI structure of claim 1, wherein the hexagonal shaped cross section of the trench between the photodiode region and the pixel transistor region is diamond shaped.

5. The STI structure of claim 1, wherein the trench has an extended hexagonal shaped cross-section parallel to a length direction of photodiode region.

6. The STI structure of claim 1, further comprising a boron-doped area in said semiconductor substrate surrounding said STI structure.

7. A CMOS image sensor formed in a semiconductor substrate having a front-side surface comprising:
a first photodiode region comprising at least a first photodiode;
a second photodiode region comprising at least a second photodiode;
a pixel transistor region between the first photodiode region and the second photodiode region and comprising at least one transistor having a gate on the front-side surface and a source/drain in the semiconductor substrate adjacent to the gate;
a first shallow trench isolation (STI) structure comprising a first trench filled with a dielectric material, the first trench having a first depth D relative to the front-side surface to provide isolation between the first photodiode region and the pixel transistor region, said first trench having a hexagonal shaped cross-section in the semiconductor substrate between the first photodiode region and the pixel transistor region, wherein a width of the first trench varies along a depth of the first trench in the semiconductor substrate from a first width W at the front-side surface to a second width $W_1$ larger than the first width W at a second depth $D_1$ relative to the front-side surface then to a third width $W_2$ smaller than the first width W at the first depth D, wherein the first depth D is greater than the second depth $D_1$ with respect to the front-side surface; and
a second STI structure disposed between the second photodiode region and the pixel transistor region and spaced from the first STI structure, the second STI structure comprising a second trench having the first depth D filled with a dielectric and having the hexagonal shaped cross-section.

8. The CMOS image sensor of claim 7,
wherein a spacing between the first STI structure and the second STI structure varies along the depths of the first STI structure and the second STI structure; where the spacing at the front-side surface has a first separation width, decreases to a second separation width at the second depth $D_1$ and increases to a third separation width at the first depth D.

9. The CMOS image sensor of claim 8, wherein the gate of the at least one transistor partially overlaps the first and the second STI structures.

10. The CMOS image sensor of claim 8 wherein the at least one photodiode in each of the first and second photodiode regions comprises a doped region having a first conductive type, the CMOS image sensor further comprising:
a well region of second conductive type opposite to the first conductive type disposed in the semiconductor substrate, wherein the first and the second STI structures are disposed in the well region.

11. The CMOS image sensor of claim 8, wherein a junction depth of the source/drain is less than the first depth D of the first STI structure and the second STI structure.

12. The CMOS image sensor of claim 8, wherein each of the first and second trenches has an extended hexagonal shaped cross-section parallel to a length direction of photodiode region.

13. The CMOS image sensor of claim 7, wherein the first depth D is approximately 120-150 nm.

14. The CMOS image sensor of claim 7, wherein the second depth $D_1$ is approximately 10-60 nm.

15. The CMOS image sensor of claim 7, further comprising a boron-doped area in said semiconductor substrate surrounding said first STI structure.

* * * * *